(12) United States Patent
Pichamuthu et al.

(10) Patent No.: US 7,900,112 B2
(45) Date of Patent: Mar. 1, 2011

(54) SYSTEM AND METHOD FOR DIGITAL LOGIC TESTING

(75) Inventors: Kenneth Pichamuthu, Bangalore (IN); Prakash Venkitaraman, Bangalore (IN); Andrew Ferko, Waterbury, VT (US)

(73) Assignee: International Business Machines Corporation, Armonk, NY (US)

( * ) Notice: Subject to any disclaimer, the term of this patent is extended or adjusted under 35 U.S.C. 154(b) by 287 days.

(21) Appl. No.: 12/173,651

(22) Filed: Jul. 15, 2008

(65) Prior Publication Data

US 2010/0017668 A1    Jan. 21, 2010

(51) Int. Cl.
*G01R 31/28* (2006.01)

(52) U.S. Cl. ........... 714/741; 714/738; 714/724; 714/37; 714/726; 714/729; 716/4; 716/5; 716/14; 716/15

(58) Field of Classification Search .................. None
See application file for complete search history.

(56) References Cited

U.S. PATENT DOCUMENTS

| | | | |
|---|---|---|---|
| 5,187,712 A | | 2/1993 | Malleo-Roach et al. |
| 6,301,688 B1 * | 10/2001 | Roy .................................. 716/4 |
| 6,385,750 B1 * | 5/2002 | Kapur et al. ................. 714/738 |
| 6,532,571 B1 | 3/2003 | Gabrielson et al. |
| 6,636,995 B1 * | 10/2003 | Dean et al. ..................... 714/724 |
| 6,651,197 B1 | 11/2003 | Wildes et al. |
| 6,671,838 B1 | 12/2003 | Koprowski et al. |
| 2002/0116690 A1 * | 8/2002 | Lackey ............................. 716/4 |

OTHER PUBLICATIONS

Geuzebroek et al, "Test Point Insertion for Compact Test Sets", Paper 10.4, Proceedings of ITC International Test Conference, Atlantic City N J, Oct. 2000, pp. 292-301.*
Nakao et al., "Low Overhead Test Point Insertion for Scan-Based BIST", ITC International Test Conference 1999, pp. 348-357.*
Geuzebroek et al, "Test Point Insertion for Compact Test Sets", Paper 10.4, Proceedings of ITC International Test Conference, Atlantic City NJ, Oct. 2000, pp. 292-301.

* cited by examiner

*Primary Examiner* — John P Trimmings
(74) *Attorney, Agent, or Firm* — Deepak Malhotra; Grant A. Johnson

(57) ABSTRACT

Some embodiments provide a method of digital logic design and digital logic testing of logic under test, the logic including latches, the latches including measure latches, which are latches that measure focal faults more than other latches, and care bit latches, which are latches that require specific input values to test a fault, wherein a focal fault is a randomly selected untested fault in the logic under test, the method comprising generating test patterns for the logic under test; fault simulating the test patterns on the logic under test; ranking measure latches based on the number of focal faults they respectively measure; and tracing back a number of levels from at least some of the highest ranked measure latches and inserting test observe latches. Other methods and systems are also provided.

20 Claims, 5 Drawing Sheets

SYSTEM AND METHOD FOR DIGITAL LOGIC TESTING

TECHNICAL FIELD

The technical field comprises digital logic design and testing.

BACKGROUND

Logic products on integrated circuit chips need to be tested to determine if there were errors during manufacturing that could result in faulty operation. To test these manufactured chips, devices called testers are used. Test patterns are generated to test faults (which are modeled to imitate physical defects). A defect is an unintended difference between implemented hardware and its intended design. These test patterns are applied to manufactured chips to determine if they are defective.

In order to make the testing of a logic product (or chip) easier, scan latches are added to it. These scan latches are chained together to form scan chains. The scan latches are filled with certain values through probes on the tester. The scan latches are used to launch values into the combinational logic under test and to measure values from the combinational logic. The values in the scan latches can be flushed out to compare with the "good" or expected values.

If the logic product has a defect, the test that shows up the fault that models this defect would result in a different response to the expected value.

During fabrication, wafers containing many chips are typically manufactured. These are then subject to a preliminary test to eliminate faulty chips. Good chips are then cut out of the wafer and are then packaged; e.g., into a module. This is typically followed by a more extensive module test before shipping good parts out of module test to the customer.

Automatic Test Pattern Generation (ATPG) is an electronic design method used to find input or test sequences (test vectors) that, when applied to a digital circuit, enable testers to distinguish between the correct circuit behavior and the faulty circuit behavior caused by defects. The acronym ATPG is also used to describe an Automatic Test Pattern Generator. The generated vectors are applied to the inputs of circuits under test. Upon receipt of each test vector (e.g., patterns of ones and zeros), the circuit under test responds by producing responses at its outputs (e.g., patterns of ones and zeros). If the circuit under test is operating properly, the response at each output of the circuit will match expected responses for each test vector. If a fault exists, a mismatch occurs. A fault is a representation of a defect at an abstracted function level.

There are two major ATPG methods: pseudorandom and deterministic ATPG. When faults on the design are specifically targeted by the test pattern generator to create tests, this is called deterministic ATPG. Test patterns generated are then loaded onto the design through a tester. Algorithmic methods for test generation are examples of deterministic ATPG, since the tests are systematically developed with a definite outcome for the targeted faults. One form of deterministic ATPG is described in U.S. Pat. No. 6,385,750 to Kapur et al., which is incorporated herein by reference.

Some chips designs, such as some Application-Specific Integrated Circuit (ASIC) chip designs, require a large number of deterministic test patterns from an Automatic Test Pattern Generator to reach the final maximum test coverage. This large number of test patterns may not fit in the buffer of the Automatic Test Pattern Generator and therefore may reduce the amount of testing of the circuit under test that takes place. Large amounts of test patterns also require longer test application times and ATPG time.

Some chips include built-in self test (BIST) logic. BIST on-chip logic generates test patterns on the fly using 'pseudorandom' patterns that detect faults (by luck) based test methods are popular in the industry. However, the quality of such BIST tests (and the test coverage that can be achieved) is not very high. Also, diagnostics of faulty chips is quite difficult. Due to these reasons, most ASICs use test patterns generated deterministically by a test pattern generator tool (that specifically target faults on the chip design) that provides higher test coverage. These test patterns are later loaded onto manufactured chips through testers.

Test pattern insertion is frequently used as a method to improve test coverage when BISTs are involved. A look into some of the solutions to similar problems involving test point insertion shows that many of them discuss improving pseudo-random testability. These are for BIST-based test solutions. The emphasis there is on improved test coverage (pattern count is not an issue as tests are generated on-chip). Test points introduced into the design through these methods do not work as well when test patterns are generated through deterministic methods where test coverage is already good but test volumes need to be kept low.

Some other solutions use test point insertion algorithms (algorithms that can be applied to a design that make suggestions about where test points can be added to improve testability) that have a 'cost function' associated with each node in the design. See "Test Point Insertion for Compact Self Tests," by M. J. Geuzebroek, J. Th. Van der Linden, and A. J. van de Goor. Nodes that are less testable (determined by probabilities of controlling and observing '0's and '1's at that node) are assigned a higher cost. Test points (observe and control) are added at the 'costliest' nodes to decrease the cost function. A typical drawback with using this approach is that these algorithms are independent of the test pattern generator tool. If the cost function is not compatible with the algorithm that the test generator uses for creating test patterns, test point insertion will not be that effective.

Other solutions involve analyzing controllability and observability indices to determine where test points can be inserted. See "Essentials of Electronic Testing," by Michael L. Bushnell, and Vishwani D. Agrawal. However, re-converging signals may correlate and controllability calculations may become inaccurate at the re-convergence point. Controllability and observability index calculations assume that each node in the design can be independently controlled. A re-convergence point occurs when, for example, a net splits into two, and the two child nets converge at the inputs of a downstream logic gate (like an 'AND' or an 'OR' for example). Since they originate from the same parent net, these two nodes at the input of the downstream gate cannot be independently controlled and the indices calculated at this point are inaccurate.

Random Resistant Fault Analysis (see, e.g., U.S. Pat. No. 6,532,571 to Gabrielson et al.; and U.S. Pat. No. 6,671,838 to Koprowski et al., both of which are incorporated herein by reference) is a tool that can find places to add test points to aid in detecting faults randomly, but does not necessarily put test points where deterministic ATPG needs them. A point that may appear random resistant can be simple for deterministic ATPG to test. Further, it is difficult to determine the starting point from which to run a random resistant fault analysis. The starting point should be at some point relatively high in the test coverage curve to obtain a useful result.

U.S. Pat. No. 6,385,750 to Kapur et al. discloses monitoring fault propagation to determine nets in the design to which faults are propagated as the faults are being simulated. Nets at which fault propagation discontinues (e.g., de-sensitized) are also monitored. Based on the fault propagation information, test points are selectively inserted to maximize the fault coverage of the set of test patterns. The method of U.S. Pat. No. 6,385,750 is directed more towards increasing fault coverage. Further, the method of U.S. Pat. No. 6,385,750 is a tool developer's solution and has to be stitched into the test generation tool.

Advances in technology, as we enter the sub-micron era, have resulted in increased logic density. With increased density and complexity of logic products, it is becoming increasingly difficult to test hardware designs. Test pattern volumes have gone up, increasing the time spent at the tester, hence increasing test costs.

SUMMARY

Various embodiments provide a system and method for reducing the number of test patterns required to test a semiconductor chip, and may incidentally increase test coverage.

Some embodiments provide a method of digital logic design and digital logic testing of logic under test, the logic including latches, the latches including measure latches, which are latches that measure focal faults more than other latches, and care bit latches, which are latches that require specific input values to test a fault, wherein a focal fault is a randomly selected untested fault in the logic under test, the method comprising:
 (a) generating test patterns for the logic under test;
 (b) fault simulating the test patterns on the logic under test;
 (c) ranking measure latches based on the number of focal faults they respectively measure; and
 (d) tracing back a number of levels from at least some of the highest ranked measure latches and inserting test observe latches.

DETAILED DESCRIPTION OF THE ILLUSTRATED EMBODIMENTS

Various embodiments provide a system and method of identifying areas in the chip design where 'test points' can be added to help reduce manufacturing test pattern volume and cost with minimal modifications to the existing chip design. An observe point or test point is a latch that is added to a design to observe a value in a particular node of the design. This test point increases the observability and hence the testability of the design. This is illustrated in FIG. 1.

Figure 1:
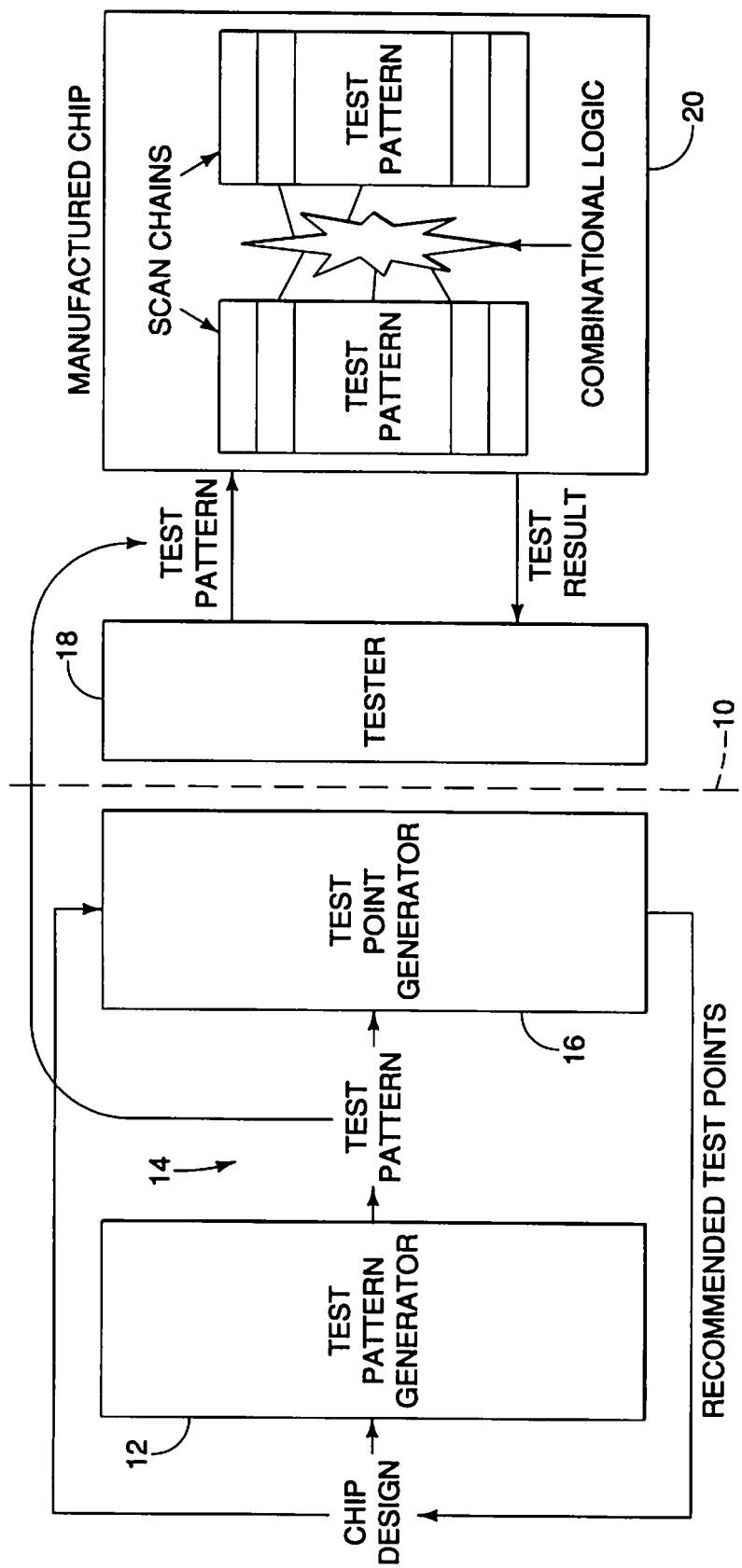
FIG. 1 is a block diagram view that illustrates a system and method in accordance with various embodiments.

FIG. 1 shows a dotted line 10, and a test pattern generator 12, test pattern 14, and a test point generator 16 to the left of the dotted line 10. FIG. 1 also shows a tester 18 and a manufactured chip 20 to the right of the dotted line 10. The part of the figure to the left of the vertical dotted line 10 is the subject of embodiments of this disclosure which involves an iterative process to determine how test points can be inserted to the chip design to reduce manufacturing test pattern count. The part of the figure to the right of the dotted line 10 shows how these generated patterns are used on actual manufactured chip hardware (through scan latches stitched into scan chains) to test for defects introduced during the manufacturing flow. To make chip designs more testable, latches are stitched together into chains. Testers can contact the inputs and outputs of these chains. Values can be loaded in individual latches through these chains and observed values can be taken out to check the correctness as well. Test pattern savings introduced in the first part, to the left of the line 10, will reflect as manufacturing test cost savings in the second part, to the right of the line 10.

Various embodiments provide a system and method for reducing test data volume (and hence, cost) and increasing test coverage (as a result of having increased testability) during test pattern application on manufactured chips. This is done, in some embodiments, by inserting test points into the chip design to improve testability (observability and controllability) of the manufactured chips 20 under test. Increased test coverage is not necessarily a primary goal of this disclosure (but is a useful side-effect). In various embodiments, test points are added to the design of chips that can save both time and money during post-manufacturing tests. This approach of adding test points to the chip design can be very valuable for integrated circuit test generators who are looking for ways to reduce deterministic (targeting specific faults which are loaded onto the design via testers) test data volume on the one hand while maintaining a high test coverage on the other. While this disclosure here discusses ASICs, the systems and methods disclosed herein can be extended to any semiconductor chips that do not use on-chip self-test structures for test (such chips admitting self-test structures do not need to be hooked up to testers that load test patterns on them but can generate patterns on their own through on-chip logic).

In some embodiments, tests are generated to test randomly picked untested faults in the design called 'focal faults'. More particularly, focal faults are randomly selected faults from the design under test that the test generator picks to generate test patterns. During a simulation, the other faults get serendipitously detected. The values required to test these focal faults are traced backward to sensitize the fault, and values are propagated forward to scan latches to help ensure that the faults are testable.

Values required at these scan latches are called care bits. Care bits are latches that require values (0 or 1) to test a focal fault. The rest are "don't care," and do not affect the testability of the focal fault.

In some embodiments, the don't care bits are randomly filled (or filled in an order that is easy to compact) by the test pattern generator to help detect faults serendipitously. More particularly, in some embodiments, don't care bits are typically filled in one of 2 ways. Either random 1's and 0's or with 1's and 0's repeated. The first method is called random-fill and the second is called repeat-fill.

Typically, only 2% of all scan latches in the logic under test require 'care bits'. The next focal fault is picked and, in some embodiments, if the care bits don't clash with those of the previous pattern, test compaction occurs and the care bits are merged to form one 'test pattern'.

Test compaction is described as follows. If the don't-care bits were represented as X's, two patterns A (01XX1XX) and B (XXX1XX0) can be combined to form one pattern: 01X11X0 (where the bits represent values in latches of the scan chain). If there is a clash, it would be set aside as a new pattern. Thus, two patterns with very few care bits are more easily compacted into one. More care bits mean more collisions and hence an increased test pattern count. The rest of the scan latches in a scan chain are filled (latch-fill) with randomly generated values (don't-care bits) in some embodiments, or with an easy-to-compress string of 1's and 0's in other embodiments. These patterns are then simulated on the design to get test coverage numbers. The randomly added 1's and 0's contribute to a fair bit of coverage especially early in the simulation run through serendipitous marking of faults.

Figure 2:
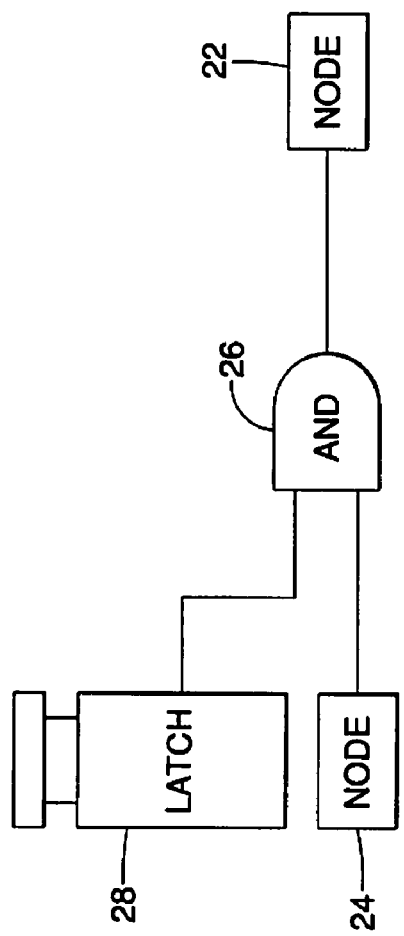
FIG. 2 is a circuit schematic illustrating an added control test point.
Figure 3:
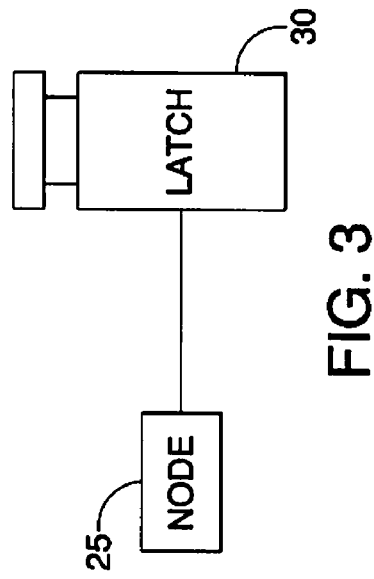
FIG. 3 is a circuit schematic illustrating an added observe test point.

Testability has two components to it—controllability and observability. If a node is made more observable (easier to observe its value at a scan latch) or more controllable (easier to control it to a certain value), the node is made more testable. FIG. 2 is a schematic illustrating an added control test point. FIG. 3 is a schematic illustrating an added observe test point.

For the example in FIG. 2, assume node 22 needs to be controlled to a '0'. The connection between node 22 and 24 is broken to insert an AND gate 26 and a latch 28 that launches a '0' when node 22 needs to be controlled to a '0'. Assume that the node 24 is the output of a multi-input 'OR' gate which probably is fed by more multi-input 'OR' gates. To set node 24 to a '0' would require all of these inputs to be held to '0' making the task of the test generator difficult. This can be fixed by adding gates 26 and 28 which constitute the control-0 test point. To control node 22 to a zero only requires gate 28 to launch a '0' into gate 26 which is an 'AND' gate. If any input to an AND gate is zero, the output will always produce an output of 0. In other modes of operation, the latch 28 launches a '1' that ensures the value node 24 is seen at node 22. This arrangement makes node 22 more controllable and hence more testable.

More particularly, testing a focal fault in the downstream logic of node 22 requires node 22 to be a '0'. If the downstream logic has a lot of such faults, this would need to happen often, each time requiring all the OR gates to have '0' values (which would mean the upstream scan latches for each of them to be at values—care bits). This places a burden on the test generator (making test generation difficult) and the increase in care bits makes test compaction difficult, resulting in a test pattern increase.

FIG. 3 illustrates adding an observe test point by adding a latch 30, substantially similar to the latch 28, after the node 25. This alternative circuitry makes test generation more difficult than if the control test point of FIG. 2 was used.

Figure 5:
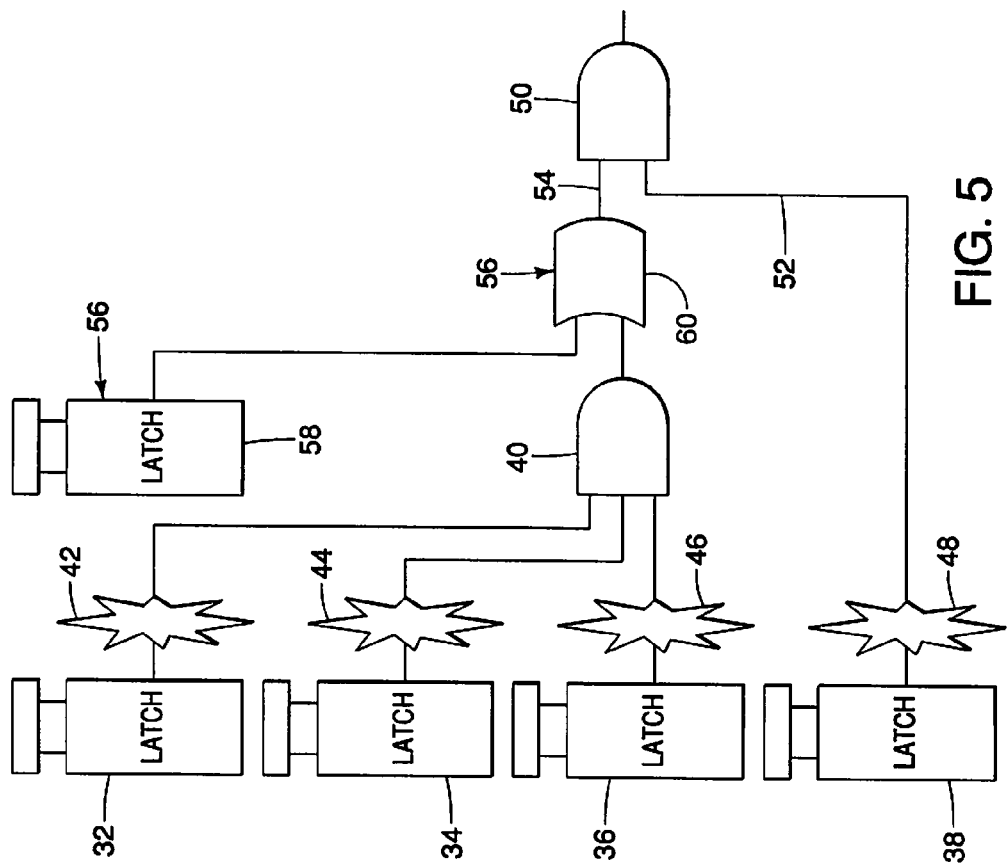
FIG. 5 is the circuit schematic of FIG. 4 after insertion of a control test point.
Figure 4:
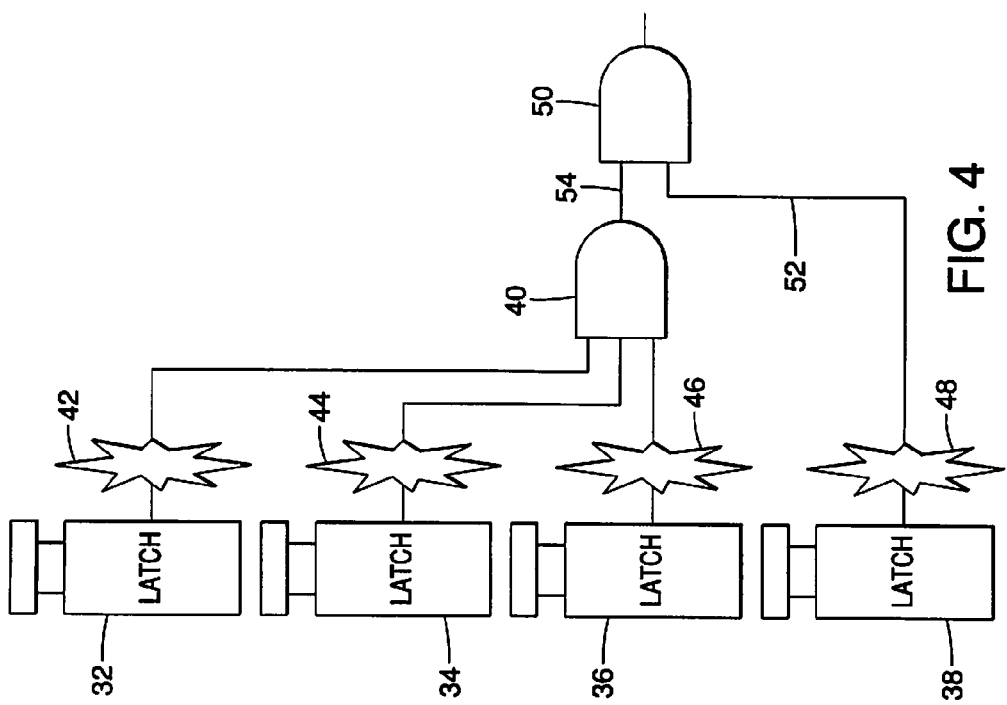
FIG. 4 is a circuit schematic before insertion of a control test point.

The improvement in observability gained by adding control points is further demonstrated in FIGS. 4 and 5 with examples. Consider the logic in FIG. 4. Three latches 32, 34, and 36 feed inputs of an AND gate 40 through combinational logic circuitry 42, 44, and 46. The output of the AND gate 40 feeds a first input of an AND gate 50. A latch 38 feeds a second input of the AND gate 50 through combinational logic circuitry 48. To test any fault on a path 52, path 54 needs to hold the AND gate 50 in the non-controlling value—'1'.

To hold path 54 to a logical value of '1', all three inputs to gate 40 need to be held high. Latches 32, 34, and 36 need to be care bits and latch 38 needs to be a care bit to excite the fault on path 'b'. However, if a control point (latch L5 and OR gate 'c') is inserted in path 52, the number of 'care bits' can be reduced significantly, thus reducing test pattern count.

FIG. 5 illustrates circuitry similar to the circuitry shown in FIG. 4 except with a control point 56 added. In the illustrated embodiment, the control point 56 includes a latch 58 and an OR gate 60. With the control point 56 inserted in path 54, the latch 58 needs a '1' (care bit) to keep path 54 at a value of '1.' When latch 58 is at a '1,' the other input to gate 60 doesn't matter, ensuring that latches 32, 34, and 36 do not need care bits. The other care bit needed is for latch 38 so that the fault can be excited. Therefore, just two care bits are needed instead of the earlier four. This example is an over-simplified representation of an actual complex design. The point is that control points added at the output of cones of very complex logic can reduce 'care bits' significantly, thus reducing test pattern count.

For the example in FIG. 3, assume node 25 has a problem with low observability (e.g., goes through some complex logic before reaching a scan latch—which requires the complex logic to be all held in non-controlling values to observe node 25). The latch (gate 30) is added to make node 25 more observable by circumventing the need to observe the node in a downstream latch through complex digital logic (the logic cone feeding the downstream latch has now been broken and the burden is shared by the inserted latch). This is purely a 'test-only' connection unlike in FIG. 2 where the functional path between nodes 24 and 22 has an extra 'AND' gate. A problem with the extra 'AND' gate of FIG. 2 is that it brings in a delay between the nodes 24 and 22 that could cause problems in closing timing on that path, particularly if it is a timing-critical one. This is why control test points are more 'costly' to add. They require extra hardware and add a delay. Observe points are therefore the more popular option unless there is much to be gained in adding some control points. The trade-off is between addition of extra hardware and test savings.

Because approximately 98% of the values in the scan chain are put in either randomly or in a pre-specified order irrespective of the logic surrounding it (don't-care), looking at the other 2% of care bits is a useful pointer towards the problematic hard-to-test areas in the logic. For example, a latch measuring a value frequently (latch hot-spot) is an indicator to observability problems in the cone of logic that feeds it. Tracing forward (downstream or to the right) or backward (upstream or to the left) from latches leads to a cone of combinational logic. Observe points inserted in this cone of logic splits the cone of logic into smaller observe cones making the logic more observable.

Figure 6:
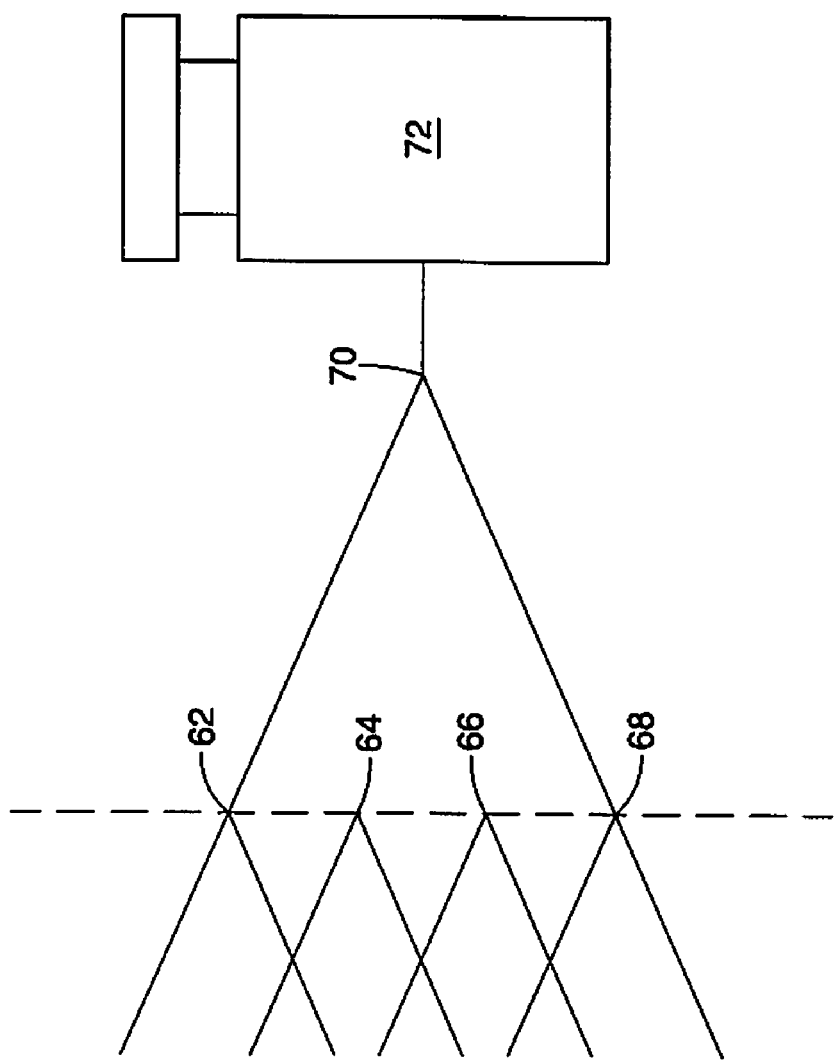
FIG. 6 is a circuit schematic showing how cones of logic can be broken into smaller, more manageable, cones by addition of observe test points, in accordance with various embodiments.

This is illustrated in FIG. 6 by insertion of observe test points (or latches) at nodes 62, 64, 66, and 68 at these points. This 'divide and conquer' approach has identified the observe latches that observe (measure) often and has attempted to break this into smaller cones that require lesser patterns to test. For example, say cone 70, feeding a latch 72, with eight inputs needed nine patterns (before addition of observe test points). If the cone 70 is split into four sections, (each with two inputs), by inserting test point latches at 62, 64, 66, and 68, respectively, each section can observe the faults in its cone in parallel. Thus, it is likely to take about three patterns to test each sub-cone. All five cones (feeding 62, 64, 66, 68 and the reduced 70) can now observe faults in parallel instead of serially (before the cone break-up). This means that it will now take three patterns to test the entire cone feeding latch 72 instead of the earlier nine.

This can also be explained with the following analogy. Think of a chip as a round stadium full of people and all around the outside are equally spaced exit doors (or observe latches). It is desired to get the people (test patterns that test faults) out as fast as possible and they all move at the same rate. If an analysis is performed, it will probably find that some exits finish exiting before others, and less people came out of those exits because of the design inside the stadium. Some exits took a longer time (latch hot-spots) because more people came out of them. It is not easy to re-design the interior of the stadium. But if it were possible to add some more exits (test points) near the exits that take the most time, this reduces the burden on the exits that take more time. This helps to ensure that the entire stadium is emptied as soon as possible (lowest test volume/test cost).

In summary, observe test points reduce pattern count by introducing parallelism while control points reduce care bit density to make pattern compaction easier, thus reducing pattern count.

In some embodiments, observe points or control points are added upstream of a latch hot-spot, after tracing backward from a latch hot-spot. Similarly, latches that require stim values very often are indicative of a controllability issue. Stim bits refer to care bits (values stimmed to excite a focal fault). Measure bits are latches that measure a value that results from a test pattern applied to a focal fault. The test pattern generator keeps track of care bits, focal faults, and measure bits.

When tracing backwards (upstream or to the left) from a latch, each logic gate encountered represents a logic level. If the user specifies a number of levels, the backward trace stops at a point corresponding to that number of logic gates.

As has been pointed out earlier, though, control points are costly to add and should therefore be added with care. Therefore, in some embodiments, control points are added only if addition of observe points do not make much difference or if adding a few control points results in drastic reductions in pattern count.

Sometimes, if there is a re-design of a custom ASIC, latch hot-spot data is useful information that can be fed back to the designers so they ensure more focus is directed on these potential problems during design to make it test-ready. In addition to adding test points to improve testability, information about which focal faults are harder to test are used, in some embodiments, as useful inputs to the test generator. In some embodiments, these faults are targeted early in the test generation effort. Targeting these faults early helps to ensure that these faults get tested when most of the coverage constitutes the serendipitously tested faults. The rest of the faults should be easier to test later making for a lower pattern count.

Figure 7:
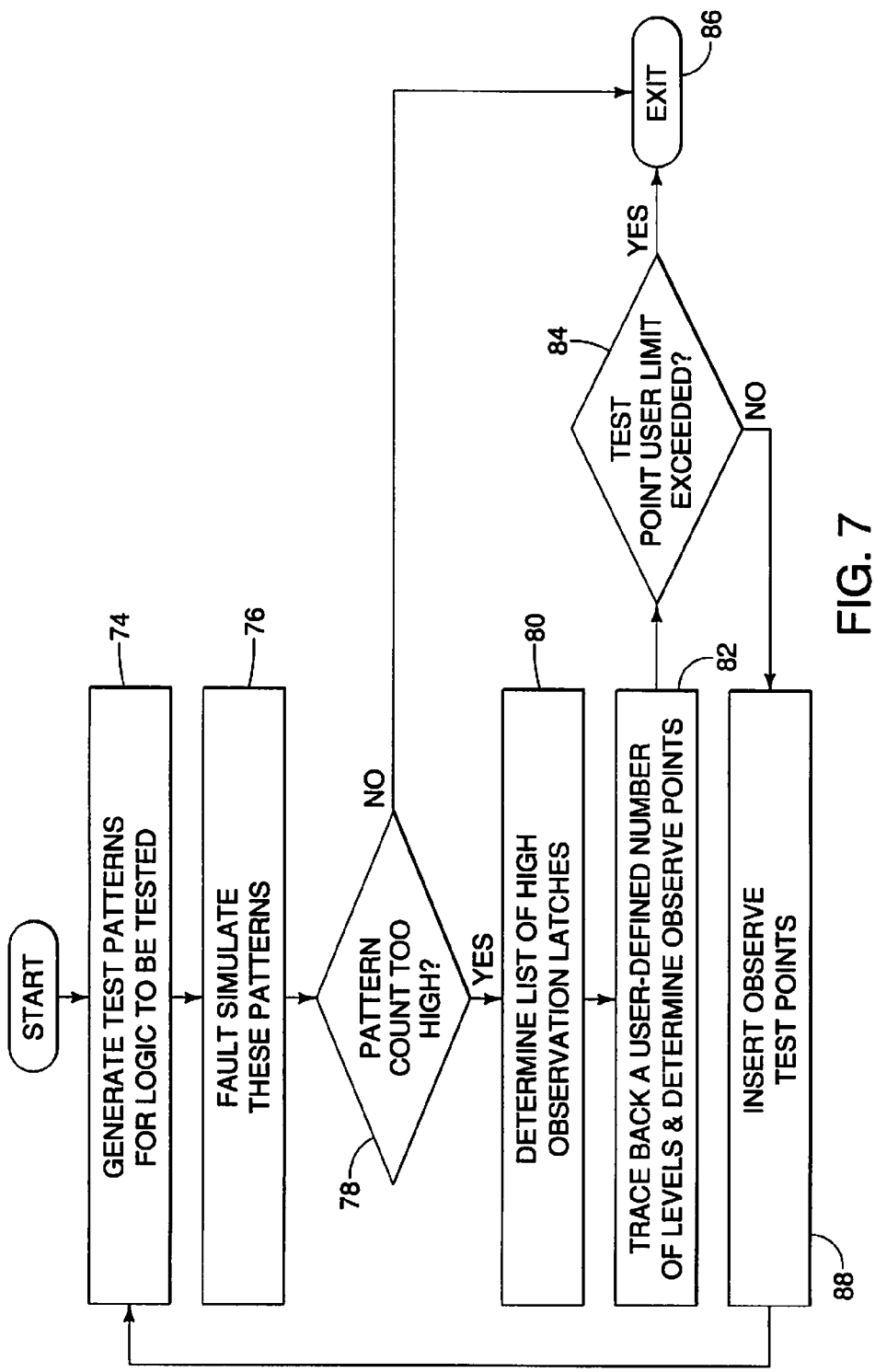
FIG. 7 is a flowchart in accordance with various embodiments.

FIG. 7 is a flow chart illustrating an implementation of this solution, in accordance with various embodiments. Though only insertion of observe points is illustrated, control points (or both observe points and control points) are inserted in alternative embodiments. It is an iterative process that adds test points to the design and then a fault simulation indicates what decrease in pattern count the inserted test points achieved. If the decrease isn't good enough or if the pattern count went down and more test points can be added, more test points are added and steps are repeated.

In step 74, test generation is run on the logic under test (not on a manufactured chip but on the logic designed, and prior to manufacturing the chip). Focal faults are targeted. In the illustrated embodiment, latches which don't require values are either assigned randomly (random-fill) or are filled with repeatable bits so that it is easy to compact (repeat-fill). In the illustrated embodiment, test compaction is also performed in this step.

The compacted test patterns are simulated on the design and the test coverage is obtained in step 76.

In step 78, a determination is made as to whether the pattern count is too high. If so, the process proceeds to step 80. If not, the process proceeds to step 86.

In step 80, further processing takes place. The latches that measured values propagated from the focal faults are analyzed and listing in order depending on how many times they measured a value. The latches that measured most often (hot spot) are, in the illustrated embodiment, put into a list from which a user-defined number of them from the top of the list can be set apart for processing in step 82. A determination as to where to add observe test points is based on latch hot spot information.

Step 82 involves tracing backward a number (e.g., a user-defined number) of logic levels (or manually tracing backward a number of logic levels based on the complexity of the logic) and determining where to insert observe test points in the design. In some embodiments, this decision is taken by observation of the logic and an analysis of which sub-cones in the logic cone has more complex logic necessitating an observe test point. Also, a decision is taken on how many logic levels need to be traced before a test point is inserted. Not all paths traced back need to have observe test points inserted. In some embodiments, the decision as to where to insert test points is performed automatically. In some embodiments, the user-defined number is five, based on experience with analyzing such logic.

A determination is made in step 84 if more than the user-specified upper bound of observe test points have been added. If not, these observe test points are inserted in step 88 and the process again starts with step 74 where tests are generated on this updated netlist (logic with observe points added).

Not always, though, will such a method be successful. Sometimes, a high test pattern count is a result of bad design practices and usage of improper building blocks or coding guidelines. These problems will be hard to patch up with test point insertion. Re-design in such cases might be necessary—or it might be necessary to simply have to live with the increased pattern count. In some embodiments, latch hot-spot information is extracted from the ATPG tool through Perl scripts. In other embodiments, ATPG tools supply such information for this kind of analysis. Also, in some embodiments, such analysis is performed earlier in the chip design flow when there is more flexibility to include changes (test points) in the design.

Various aspects of the invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, aspects of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

In compliance with the patent statutes, the subject matter disclosed herein has been described in language more or less specific as to structural and methodical features. However, the scope of protection sought is to be limited only by the following claims, given their broadest possible interpretations. The claims are not to be limited by the specific features shown and described, as the description above only discloses example embodiments.

We claim:

1. A method of digital logic design and digital logic testing of logic under test, the logic under test including latches, the latches including measure latches, which are latches that measure focal faults more than other latches, and care bit latches, which are latches that require specific input values to test a fault, wherein a focal fault is a randomly selected untested fault in the logic under test, the method comprising:
    (a) generating test patterns for the logic under test;
    (b) fault simulating the test patterns on the logic under test;
    (c) ranking measure latches based on the number of focal faults they respectively measure; and
    (d) tracing back from at least some of the highest ranked measure latches and inserting test observe latches.

2. The method in accordance with claim 1 and further comprising repeating (a), (b), (c), and (d).

3. The method in accordance with claim 1 and further comprising repeating (a), (b), (c), and (d) until a pattern count is reduced to a predetermined size.

4. The method in accordance with claim 3 and further comprising manufacturing a chip.

5. The method in accordance with claim 1 and further comprising repeating (a), (b), (c), and (d) until a pattern count is reduced to a predetermined size or the number of test observe latches exceeds a predetermined number, whichever occurs first.

6. The method in accordance with claim 1 and further comprising generating a list of faults that were measured in the measure latches.

7. The method in accordance with claim 1 wherein the number of levels is predetermined.

8. The method in accordance with claim 1 and further comprising identifying care bit latches after (b).

9. The method in accordance with claim 8 and further comprising compacting the test patterns in response to identifying the care bit latches.

10. A method of testing digital logic circuitry having a plurality of latches, the method comprising:
    (a) generating test patterns for logic to be tested;
    (b) fault simulating the patterns on the logic to be tested;
    (c) if reducing a pattern count by:
        (d) determining a list of high observation latches;
        (e) tracing back a predetermined number of levels from at least some of the high observation latches and determining a number of test points to insert;
        (f) determining if the number of test points exceeds a predetermined limit and, if not:
        (g) inserting the test points; and
        (h) proceeding to (a).

11. The method in accordance with claim 10 wherein the determining a list of high observation latches comprising ranking high observation latches.

12. The method in accordance with claim 10 and further comprising identifying care bit latches after (b).

13. The method in accordance with claim 12 and further comprising compacting the test patterns, in response to identifying the care bit latches.

14. The method in accordance with claim 10 and further comprising:
    observing the test points; and
    revising the digital logic circuitry in response to the observation of the test points.

15. The method in accordance with claim 14 and further comprising manufacturing a chip.

16. A system for digital logic testing of logic under test, the logic under test including latches, the latches including measure latches, which are latches that measure focal faults more than other latches, and care bit latches, which are latches that require specific input values to test a fault, wherein a focal fault is a randomly selected untested fault in the logic under test, the system being configured to:
    (a) generate test patterns for the logic under test;
    (b) fault simulate the test patterns on the logic under test; and
    (c) rank measure latches based on the number of focal faults they respectively measure.

17. The system in accordance with claim 16 and further configured to (d) trace back from at least some of the highest ranked measure latches and insert test observe latches.

18. The system in accordance with claim 17 wherein the number of levels is predetermined.

19. The system in accordance with claim 17 and further configured to repeating (a), (b), (c), and (d) until a pattern count is reduced to being no greater than a predetermined size.

20. The system in accordance with claim 17 and further comprising generating a list of faults that were measured in the measure latches.

* * * * *